United States Patent
Lee et al.

(10) Patent No.: US 10,504,978 B2
(45) Date of Patent: Dec. 10, 2019

(54) ELECTROLUMINESCENT DISPLAY DEVICE

(71) Applicant: LG DISPLAY CO., LTD., Seoul (KR)

(72) Inventors: Jihoon Lee, Paju-si (KR); SeungHan Paek, Paju-si (KR); Seonghyun Kim, Paju-si (KR); Changyong Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,488

(22) Filed: Dec. 19, 2018

(65) Prior Publication Data

US 2019/0206960 A1    Jul. 4, 2019

(30) Foreign Application Priority Data

Dec. 29, 2017   (KR) .................. 10-2017-0184837

(51) Int. Cl.
   *H01L 27/32*    (2006.01)
   *H01L 51/50*    (2006.01)

(52) U.S. Cl.
   CPC ........ *H01L 27/3253* (2013.01); *H01L 27/322* (2013.01); *H01L 27/3246* (2013.01); *H01L 27/3281* (2013.01); *H01L 51/5056* (2013.01); *H01L 51/5092* (2013.01)

(58) Field of Classification Search
   CPC ............. H01L 27/3253; H01L 27/3281; H01L 27/322; H01L 27/3246; H01L 51/5092; H01L 51/5056; H01L 51/5237; H01L 51/524; H01L 51/5253; H05B 33/04
   See application file for complete search history.

(56) References Cited

U.S. PATENT DOCUMENTS

| | | | |
|---|---|---|---|
| 7,749,039 B2* | 7/2010 | Park | H01L 51/5246 313/512 |
| 7,837,530 B2* | 11/2010 | Park | H01L 51/525 445/25 |
| 8,330,339 B2* | 12/2012 | Oh | H01L 51/5246 |
| 8,390,194 B2* | 3/2013 | Choi | B32B 37/12 313/512 |
| 8,405,309 B2* | 3/2013 | Lee | H01L 51/5246 313/504 |
| 9,066,386 B2* | 6/2015 | Han | H05B 33/04 |
| 9,095,018 B2* | 7/2015 | Masuda | H01L 51/5246 |
| 9,166,190 B2* | 10/2015 | Kimura | G02F 1/1339 |
| 2003/0122476 A1* | 7/2003 | Wang | H01L 51/5246 313/493 |
| 2004/0095060 A1* | 5/2004 | Ushifusa | H01J 1/70 313/495 |

* cited by examiner

*Primary Examiner* — Joseph L Williams
*Assistant Examiner* — Jose M Diaz
(74) *Attorney, Agent, or Firm* — Polsinelli PC

(57) ABSTRACT

Disclosed is an electroluminescent display device provided with a dam structure capable of improving a lateral-surface moisture permeation preventing function, and configured to reduce a bezel, wherein the electroluminescent display device comprises a first substrate, a second substrate confronting the first substrate, a dam structure configured to bond the first and second substrates to each other in the edges of the first and second substrates, wherein the dam structure includes a barrier pattern.

17 Claims, 5 Drawing Sheets

ELECTROLUMINESCENT DISPLAY DEVICE

CROSS-REFERENCE TO RELATED APPLICATION

This application claims the benefit of the Korean Patent Application No. 10-2017-0184837 filed on Dec. 29, 2017, which is hereby incorporated by reference in its entirety as if fully set forth herein.

BACKGROUND

Field of the Disclosure

The present disclosure relates to a display device, and more particularly to, an electroluminescent display device. Although the present disclosure is suitable for a wide scope of applications, it is particularly suitable for an electroluminescent display device provided with a dam structure that can alleviate problems in lateral-surface moisture permeation and reduce a bezel size of the electroluminescent display device.

Description of the Background

An electroluminescent display device is provided in such a way that an emission layer is formed between two electrodes. As the emission layer emits light by an electric field between the two electrodes, an image is displayed on the electroluminescent display device.

The emission layer may be formed of an organic material which emits light when exciton is produced by a bond of electron and hole, and the exciton falls to a ground state from an excited state. Otherwise the emission layer may be formed of an inorganic material such as quantum dot.

In the typical electroluminescent display device, a dam structure is provided in the periphery of the device to prevent moisture and oxygen from being permeated into the inside of the device. However, it is necessary to increase a width of the dam structure for improving lifespan and reliability of the electroluminescent display device. Thus, it has limitations in reducing a bezel in the electroluminescent display device.

SUMMARY

The present disclosure has been made in view of the above problems, and the present disclosure is to provide an electroluminescent display device provided with a dam structure capable of improving a lateral-surface moisture permeation preventing function, and configured to reduce a bezel.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

In accordance with an aspect of the present disclosure, the above and other objects can be accomplished by the provision of an electroluminescent display device comprising a first substrate, a second substrate facing the first substrate, a dam structure configured to bond the first and second substrates to each other in the edges of the first and second substrates, wherein the dam structure includes a barrier pattern.

In another aspect of the present disclosure, an electroluminescent display device includes first and second substrates facing each other; and a dam structure preventing surface moisture from permeating into the electroluminescent display device from a lateral side and disposed at outer edges of inner surfaces of the first and second substrates, wherein the dam structure includes lower and upper barrier patterns respectively disposed on the first and second substrates and disposed alternately with each other.

It is to be understood that both the foregoing general description and the following detailed description are exemplary and explanatory and are intended to provide further explanation of the disclosure as claimed.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Figure 1:
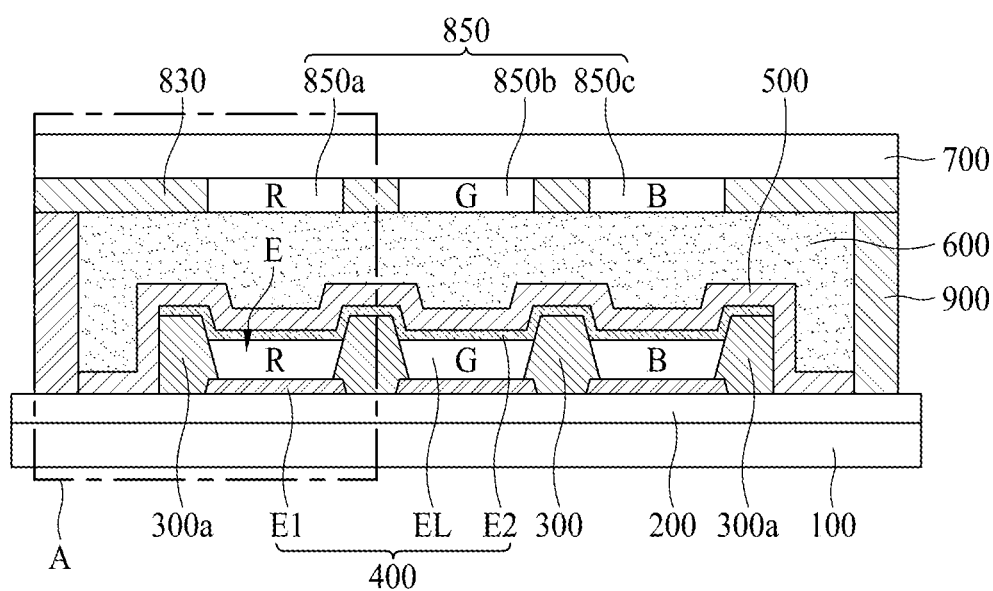
FIG. 1 is a cross-sectional view illustrating an electroluminescent display device according to one aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below,"

and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to aspects of the present disclosure will be described in detail with reference to the accompanying drawings.

FIG. 1 is a cross-sectional view illustrating an electroluminescent display device according to one aspect of the present disclosure.

Referring to FIG. 1, the electroluminescent display device according to one aspect of the present disclosure may include a first substrate 100, a circuit device layer 200, an emission device layer 400, a bank 300, a first passivation layer 500, a filling layer 600, a second substrate 700, a black matrix 830, a plurality of color filters 850, and a dam structure 900.

The first substrate 100 may be made of a glass or plastic material, but not limited to this material. The first substrate 100 may be formed of a transparent material or an opaque material. If the electroluminescent display device according to one aspect of the present disclosure is implemented as a top emission type where emitted light advances toward an upper side, the first substrate 100 may be formed of an opaque material as well as a transparent material.

The circuit device layer 200 is formed on the first substrate 100.

In the circuit device layer 200, a circuit device including various signal lines, a thin film transistor, and a capacitor is provided for each pixel. The signal lines may include a gate line, a data line, a power line, and a reference line, and the thin film transistor may include a switching thin film transistor, a driving thin film transistor, and a sensing thin film transistor.

As the switching thin film transistor is switched in accordance with a gate signal supplied to the gate line, a data voltage provided from the data line is supplied to the driving thin film transistor by the use of switching thin film transistor.

When the driving thin film transistor is switched in accordance with the data voltage supplied from the switching thin film transistor, a data current is generated by power supplied from the power line, and the generated data current is supplied to a first electrode E1.

The sensing thin film transistor senses a threshold voltage deviation of the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of gate and source terminals of the driving thin film transistor.

The bank 300 is formed in the boundary line between each of the plurality of pixels. The bank 300 is formed in a matrix configuration on the boundary line between the adjacent pixels, to thereby define emission areas E in the plurality of pixels. Thus, the bank 300 is formed in the boundary line between each of the plurality of emission areas E. That is, an opening portion in which the bank 300 is not formed becomes the emission area E.

The bank 300 according to one aspect of the present disclosure is configured to cover both ends of the first electrode E1 to be described later, and is formed on the circuit device layer 200. Thus, the plurality of first electrodes E1 patterned for the plurality of pixels may be insulated from each other by the bank 300.

The emission device layer 400 is formed on the circuit device layer 200. The emission device layer 400 may include the first electrode E1, an emission layer EL, and a second electrode E2.

The first electrode E1 is formed on the circuit device layer 200. The first electrode E1 according to one aspect of the present disclosure is patterned by each pixel, wherein the first electrode E1 may function as an anode of the electroluminescent display device. The first electrode E1 is connected with a driving thin film transistor of the circuit device layer 200.

The electroluminescent display device according to one aspect of the present disclosure may be formed as a top emission type, whereby the first electrode E1 may include a reflective material for upwardly reflecting light emitted from the emission layer EL. In this case, the first electrode E1 may be formed in a deposition structure of a transparent conductive material and the reflective material.

The emission layer EL is formed on the first electrode E1. The emission layer EL is formed in each of the plurality of emission areas E. The emission layer EL may include a red emission layer R, a green emission layer G, and a blue emission layer B provided for the respective emission areas E. The emission layer EL may include a white emission layer provided for each emission area E.

The emission layer EL according to one aspect of the present disclosure may be patterned for each emission area E by an evaporation process using a mask, or may be patterned for each emission area E by a solution process using an inkjet apparatus. Also, the emission layer EL may be formed by an evaporation method under the condition that the emission area E and the boundary area of the emission area E are not covered by a mask. In this case, the emission layer EL may be formed on the bank 300 as well as the first electrode E1. The emission layer EL may be formed of a white emission layer.

At least one organic layer among a hole injecting layer, a hole transporting layer, an organic emitting layer, an electron transporting layer, and an electron injecting layer included in the emission layer EL may be formed by a solution process. Also, at least one of the electron transporting layer and the electron injecting layer may extend to an upper surface of the bank 300, and may be formed on an entire surface of the bank 300.

The second electrode E2 is formed on the emission layer EL, and the second electrode E2 may function as a cathode of the electroluminescent display device.

The second electrode E2 according to one aspect of the present disclosure may be formed on the bank 300 as well as the emission layer EL, and also may be wholly formed on the plurality of emission areas E and the boundary area between each of the plurality of emission areas E. Thus, the second electrode E2 may function as a common electrode for applying a common voltage to the plurality of pixels.

The electroluminescent display device according to one aspect of the present disclosure may be formed in a top emission type. Thus, the second electrode E2 may be formed of a transparent conductive material for upwardly advancing light emitted from the emission layer EL, or may be formed at a small thickness to improve transmittance. In this case, an auxiliary electrode with high electrical conductivity may be connected with the second electrode E2 to reduce a resistance of the transparent conductive material.

The first passivation layer 500 is provided to cover the emission device layer 400. That is, the first passivation layer 500 is formed on the second electrode E2, to thereby protect the first electrode E1, the emission layer EL, and the second electrode E2 from an external moisture permeation. The first passivation layer 500 may be formed of an inorganic insulating material, for example, a single-layered structure of silicon dioxide ($SiO_2$) or silicon nitride ($SiN_x$), or a multi-layered structure of silicon dioxide ($SiO_2$) and silicon nitride ($SiN_x$), but not limited to these structures.

The filling layer 600 is formed on the first passivation layer 500. For example, the filling layer 600 is provided between an upper surface of the first passivation layer 500 and a lower surface of the black matrix 830 formed in the second substrate 700, and also provided between an upper surface of the first passivation layer 500 and a lower surface of the plurality of color filters 850 formed in the second substrate 700. The filling layer 600 may be filled in a space defined by the dam structure 900, the first passivation layer 500, the black matrix 830, and the plurality of color filters 850. The filling layer 600 according to one aspect of the present disclosure may be formed of various materials generally known to those in the art, for example, an organic material.

The second substrate 700 is disposed on a front surface for displaying an image. Thus, the second substrate 700 is formed of a transparent material, and the second substrate 700 may serve to prevent moisture-permeation. Thus, the second substrate 700 prevents external moisture from being permeated into the inside of the electroluminescent display device. The second substrate 700 may be bonded to the first substrate 100 by the use of dam structure 900.

The black matrix 830 may be formed in a pattern shape on the second substrate 700. For example, the black matrix 830 may be formed between each of the plurality of color filters 850. The black matrix 830 may prevent the interference of light emitted from each pixel, and may absorb externally-provided light to prevent a reflection of the light. Thus, light is not transmitted through the area provided with the black matrix 830. The black matrix 830 may be formed of an organic material.

The plurality of color filters 850 are formed on the second substrate 700. The plurality of color filters 850 may be provided at fixed intervals under the circumstances that the black matrix 830 is disposed between each of the plurality of color filters 850. The plurality of color filters 850 may include a first color filter 850*a*, a second color filter 850*b*, and a third color filter 850*c*. In this case, the first color filter 850*a* may be a red color filter, the second color filter 850*b* may be a green color filter, and the third color filter 850*c* may be a blue color filter, but not necessarily. The first color filter 850*a*, the second color filter 850*b*, and the third color filter 850*c* respectively confront the corresponding emission layers EL of the emission areas E. The plurality of color filters 850 may be formed of an organic material.

The dam structure 900 is formed in the edges of the first substrate 100 and the second substrate 700, whereby the first substrate 100 and the second substrate 700 are bonded to each other by the use of dam structure 900. Thus, the dam structure 900 may include an adhesive material.

The dam structure 900 according to one aspect of the present disclosure may have a shape corresponding to that of each of the first and second substrates 100 and 700 on the plane, whereby the edges of the first and second substrates 100 and 700 are surrounded by the dam structure 900. The dam structure 900 prevents an outflow of the filling layer 600 to the outside, whereby the inside of the electroluminescent display device may be sealed by the dam structure 900.

Figure 2:
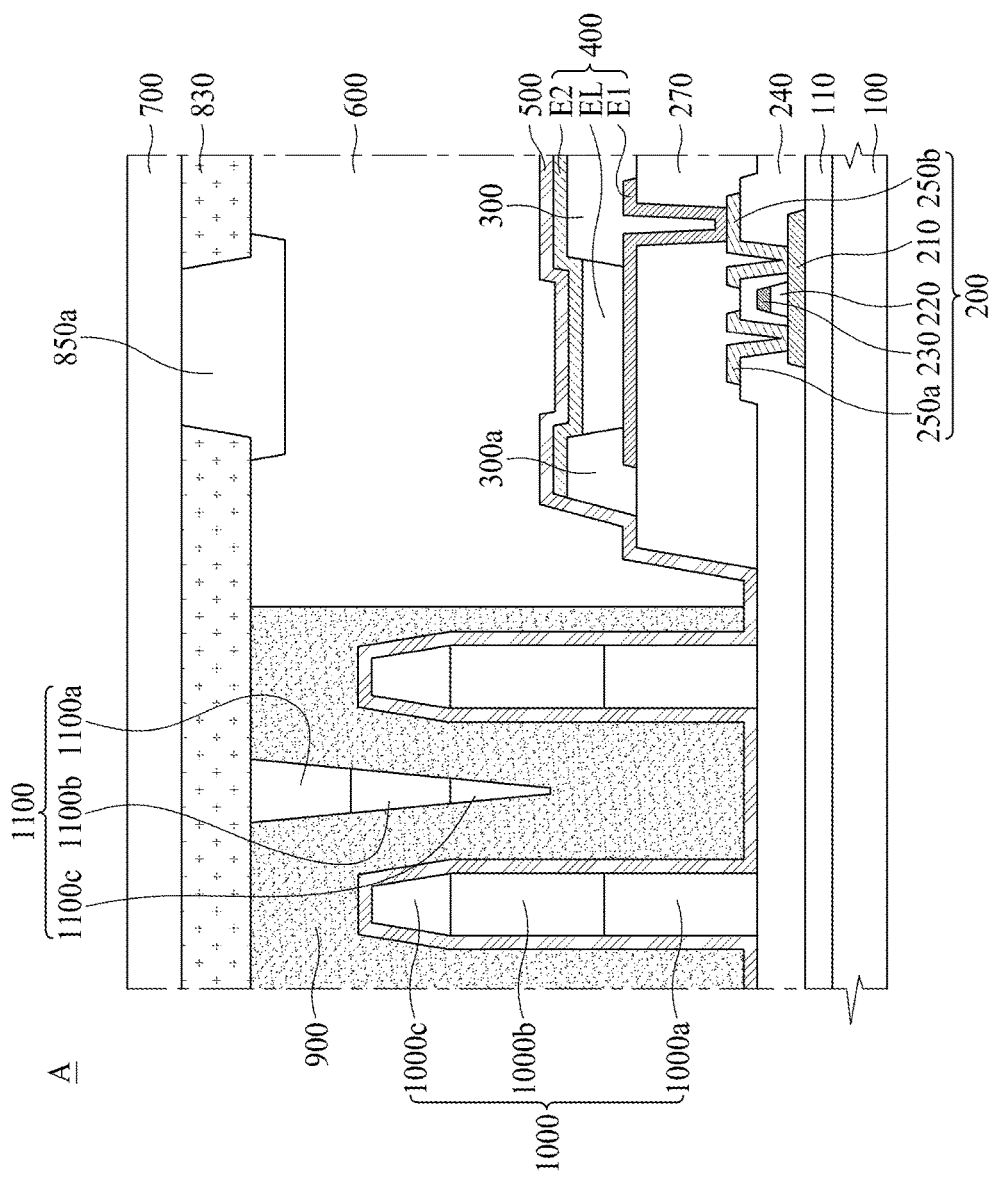
FIG. 2 is a cross-sectional view showing enlarged 'A' portion of FIG. 1 in an electroluminescent display device according to a first aspect of the present disclosure.

FIG. 2 is a cross-sectional view showing enlarged 'A' portion of FIG. 1 in an electroluminescent display device according to a first aspect of the present disclosure. Hereinafter, a detailed description for the same parts as the above will be omitted, and only the different structures will be described in detail as follows.

Referring to FIG. 2, the electroluminescent display device according to the first aspect of the present disclosure may include a buffer layer 110, a circuit device layer 200, an emission device layer 400, a filling layer 600, and a dam structure 900.

The buffer layer 110 is formed on a first substrate 100. The buffer layer 110 according to an aspect of the present disclosure prevents moisture from being permeated into the inside of the circuit device layer 200. The buffer layer 110 may be formed of an inorganic insulating material, for example, a single-layered structure of silicon dioxide ($SiO_2$) or silicon nitride ($SiN_x$), or a multi-layered structure of silicon dioxide ($SiO_2$) and silicon nitride ($SiN_x$), but not limited to these structures.

The circuit device layer 200 is formed on the buffer layer 110, and the circuit device layer 200 may include a thin film transistor array. In addition, a planarization layer 270 may be formed on the circuit device layer 200.

The thin film transistor array may include an active layer 210, a gate insulating film 220, a gate electrode 230, an insulating interlayer 240, a source electrode 250a, and a drain electrode 250b. FIG. 2 shows a top gate structure thin film transistor, but not limited to this structure. For example, a bottom gate structure thin film transistor may be implemented in which the gate electrode 230 is formed below the active layer 210.

The active layer 210 is formed on the buffer layer 110. The active layer 210 may be formed of a silicon-based semiconductor material or an oxide semiconductor material, but not limited to these materials. In addition, a light shielding layer (not shown) may be additionally provided between the active layer 210 and the first substrate 100 according to one aspect of the present disclosure. The light shielding layer prevents light from being advanced to the active layer 210, to thereby prevent deterioration of the active layer 210.

The gate insulating film 220 is formed on the active layer 210, to thereby insulate the active layer 210 and the gate electrode 230 from each other.

The gate electrode 230 is formed on the gate insulating film 220.

The insulating interlayer 240 is formed on the gate electrode 230, to thereby insulate the gate electrode 230 from the source/drain electrodes 250a/250b.

The source electrode 250a and the drain electrode 250b being opposite to each other are provided at a fixed interval from each other while being disposed on the insulating interlayer 240. The source electrode 250a and the drain electrode 250b are respectively connected with one end and the other end of the active layer 210 via contact holes provided in the insulating interlayer 240 and the gate insulating film 220.

The insulating interlayer 240 according to one aspect of the present disclosure may be formed of an inorganic material, and the insulating interlayer 240 may extend under a lower surface of the dam structure 900. Referring to FIG. 2, only the insulating interlayer 240 extends below the lower surface of the dam structure 900, whereby the insulating interlayer 240 is in contact with the lower surface of the dam structure 900, but not limited to this structure. Also, the gate insulating film 220 formed of an inorganic material may extend under the lower surface of the dam structure 900.

When the lower surface of the dam structure 900 is in contact with the circuit device layer 200, the contact between the lower surface of the dam structure 900 and the inorganic material layer in the deposition structure of the circuit device layer 200 is favorable to a moisture-permeation preventing efficiency.

The planarization layer 270 is provided to cover the thin film transistor array, to thereby planarize a surface of the first substrate 100. The planarization layer 270 may be formed of an organic material. In this case, the planarization layer 270 is not in contact with the lower surface of the dam structure 900. For example, when the planarization layer 270 of the organic material extends below the lower surface of the dam structure 900, external moisture may be permeated into the inside of the device through the planarization layer 270. Thus, the planarization layer 270 is not in contact with the lower surface of the dam structure 900.

The planarization layer 270 according to one aspect of the present disclosure may have a high thickness. For example, the planarization layer 270 may be provided with a plurality of layers instead of one layer. For example, the planarization layer 270 may be formed in a dual-layered structure by a first process for forming a first planarization layer, and a second process for forming a second planarization layer. This planarization layer 270 has the high thickness so that it is possible to improve reliability of planarization, and to facilitate a next process of forming the emission device layer 400.

As described above, the emission device layer 400 may include a first electrode E1, an emission layer EL, and a second electrode E2.

The first electrode E1 may be connected with the drain electrode 250b of the thin film transistor via a contact hole provided in the planarization layer 270. In some cases, the first electrode E1 may be connected with the source electrode 250a of the thin film transistor via a contact hole provided in the planarization layer 270.

The emission layer EL may include a red emission layer, a green emission layer, and a blue emission layer for respectively emitting light having a color preset in each pixel.

Although not shown, the emission layer EL according to another aspect of the present disclosure may be a common layer formed for the pixels in common. In this case, it is possible to simplify a manufacturing process. The emission layer EL may include any one among an emission device layer, an inorganic emission layer, and a quantum dot emission layer, or may include a deposition structure or mixture structure of an emission device layer (or inorganic emission layer) and a quantum dot emission layer. The emission layer EL may include two or more emission parts for emitting white light. For example, the emission layer EL may include a first emission part and a second emission part for emitting white light by a mixture of first light and second light. Herein, the first emission part for emitting the first light may include any one among a blue emission part, a green emission part, a red emission part, a yellow emission part, and a yellowish green emission part. The second emission part for emitting the second light may include an emission part for emitting light whose color is complementary to the color of the first light, which may be selected from the blue emission part, the green emission part, the red emission part, the yellow emission part, and the yellowish green emission part.

The second electrode E2 is formed on the bank 300 as well as the emission layer EL, and the second electrode E2 functioning as a cathode may be a common layer formed for the pixels in common.

The filling layer 600 may be filled in a space between the planarization layer 270 and the dam structure 900 so that the planarization layer 270 and the dam structure 900 may be provided at a predetermined interval from each other.

The dam structure 900 may include a moisture-permeation preventing material so that it is possible to prevent external moisture from being permeated into the inside of the device. The dam structure 900 according to one aspect of the present disclosure may include a barrier pattern 1000 and/or 1100.

The barrier pattern 1000 and/or 1100 is formed inside the dam structure 900. The barrier pattern 1000 and/or 1100 prevents external moisture from being permeated into the inside of the circuit device layer 200 and the emission device layer 400, to thereby prevent dark spot and peeling-off failures. The barrier pattern 1000 and/or 1100 according to one aspect of the present disclosure may include a lower barrier pattern 1000 and an upper barrier pattern 1100.

The lower barrier pattern 1000 is formed on the first substrate 100. In detail, the lower barrier pattern 1000 may be in contact with an upper surface of the insulating interlayer 240. The lower barrier pattern 1000 may have a thickness great enough to prevent external moisture and oxygen from being permeated into the inside of the circuit device layer 200 and the emission device layer 400 through a lateral surface of the dam structure 900. The lower barrier pattern 1000 may include a first lower barrier pattern 1000a, a second lower barrier pattern 1000b, and a third lower barrier pattern 1000c.

The first lower barrier pattern 1000a is in contact with the upper surface of the insulating interlayer 240. The first lower barrier pattern 1000a may be formed of the same material as that of the planarization layer 270. For example, the first lower barrier pattern 1000a may be formed of the same material as that of the planarization layer 270 for the first process for forming the planarization layer 270. The first lower barrier pattern 1000a may have a first thickness d1. Herein, the first thickness d1 may be about 3 μm.

The second lower barrier pattern 1000b is in contact with an upper surface of the first lower barrier pattern 1000a. The second lower barrier pattern 1000b may be formed of the same material as that of the planarization layer 270. For example, the second lower barrier pattern 1000b may be formed of the same material as that of the planarization layer 270 for the second process for forming the planarization layer 270. The second lower barrier pattern 1000b may have a second thickness d2. Herein, the second thickness d2 may be about 3~5 μm.

The third lower barrier pattern 1000c is in contact with an upper surface of the second lower barrier pattern 1000b. The third lower barrier pattern 1000c may be formed of the same material as that of the bank 300. For example, the third lower barrier pattern 1000c may be formed of the same material as that of the bank 300 for the process for forming the bank 300. The third lower barrier pattern 1000c may have a third thickness d3. Herein, the third thickness d3 may be about 2 μm.

Accordingly, the lower barrier pattern 1000 may be formed in a three-layered structure, and the upper surface and side surface (or side walls) of the lower barrier pattern 1000 may be covered by the first passivation layer 500. For example, the first passivation layer 500 is formed on the second electrode E2 so as to cover the side surfaces of the bank 300 and the planarization layer 270 so that the first passivation layer 500 extends to the inside of the dam structure 900 so as to cover the side surface and upper surface of the lower barrier pattern 1000. That is, after completing a deposition process of the second electrode E2, the first passivation layer 500 may be formed on an entire surface of the first substrate 100 so as to cover the second electrode E2 and the lower barrier pattern 1000.

The lower barrier pattern 1000 according to one aspect of the present disclosure may be formed as a barrier of a high thickness having a total value obtained by adding each of the first to third thicknesses d1 to d3 together. Herein, the total value obtained by adding each of the first to third thicknesses d1 to d3 together may be about 6~8 μm. The lower barrier pattern 1000 is covered by the first passivation layer 500 of the inorganic material so that it is possible to prevent a permeation of external moisture and oxygen. For example, even though the external moisture and oxygen may permeate into the inside of the device through the side surface of the dam structure 900 formed of the organic material, the permeation of external moisture and oxygen may be blocked by the lower barrier pattern 1000 having the high thickness and the first passivation layer 500 for covering the lower barrier pattern 1000. The first passivation layer 500 is formed of the inorganic material having the property capable of preventing the permeation of moisture and oxygen. That is, the external moisture and oxygen cannot penetrate through the lower barrier pattern 1000 covered by the first passivation layer 500.

The upper barrier pattern 1100 is formed on the second substrate 700. In detail, the upper barrier pattern 1100 may be in contact with a lower surface of the black matrix 830. The upper barrier pattern 1100 may have a thickness thick enough to prevent external moisture and oxygen from being permeated into the inside of the circuit device layer 200 and the emission device layer 400 through the side surface of the dam structure 900. The upper barrier pattern 1100 may include a first upper barrier pattern 1100a, a second upper barrier pattern 1100b, and a third upper barrier pattern 1100c.

The first upper barrier pattern 1100a is in contact with the lower surface of the black matrix 830. The first upper barrier pattern 1100a may be formed of the same material as that of the first color filter 850a. For example, the first upper barrier pattern 1100a may be formed of the same material as that of the first color filter 850a for the process of forming the first color filter 850a. The first upper barrier pattern 1100a may have a fourth thickness d4. Herein, the fourth thickness d4 may be about 2~2.5 μm.

The second upper barrier pattern 1100b is in contact with an upper surface of the first upper barrier pattern 1100a. The second upper barrier pattern 1100b may be formed of the same material as that of the second color filter 850b. For example, the second upper barrier pattern 1100b may be formed of the same material as that of the second color filter 850b for the process of forming the second color filter 850b. The second upper barrier pattern 1100b may have a fifth thickness d5. Herein, the fifth thickness d5 may be about 2~2.5 μm.

The third upper barrier pattern 1100c is in contact with an upper surface of the second upper barrier pattern 1100b. The third upper barrier pattern 1100c may be formed of the same material as that of the third color filter 850c. For example, the third upper barrier pattern 1100c may be formed of the same material as that of the third color filter 850c for the process of forming the third color filter 850c. The third upper barrier pattern 1100c may have a sixth thickness d6. Herein, the sixth thickness d6 may be about 2~2.5 μm.

Accordingly, the upper barrier pattern 1100 may be formed in a three-layered structure. The upper barrier pattern 1100 according to one aspect of the present disclosure may be formed as a barrier of a high thickness having a total value obtained by adding each of the fourth to sixth thicknesses d4 to d6 together. Herein, the total value obtained by adding each of the fourth to sixth thicknesses d4 to d6 together may be about 6~7.5 μm.

The lower barrier pattern 1000 and the upper barrier pattern 1100 according to one aspect of the present disclosure may be alternately formed. The dam structure 900 according to one aspect of the present disclosure may have the thickness of about 8~10 μm. The lower barrier pattern 1000 may have the thickness of about 6~8 μm, and the upper barrier pattern 1100 may have the thickness of about 6~7.5 μm, whereby the lower barrier pattern 1000 and the upper barrier pattern 1100 are not overlapped with each other. Thus, the lower barrier pattern 1000 and the upper barrier pattern 1100 are provided at fixed intervals while being alternately disposed. For example, as shown in the drawings, when the lower barrier pattern 1000 alternates with the upper barrier pattern 1100, the upper barrier pattern 1100 may be disposed between each of the lower barrier patterns 1000. The above structure of the lower barrier pattern 1000 and the upper barrier pattern 1100 shows only one aspect of the electroluminescent display device according to the present disclosure, but not limited to this structure. A pattern number in the lower barrier pattern 1000 and the upper barrier pattern 1100 may be changed in various ways.

Figure 3:
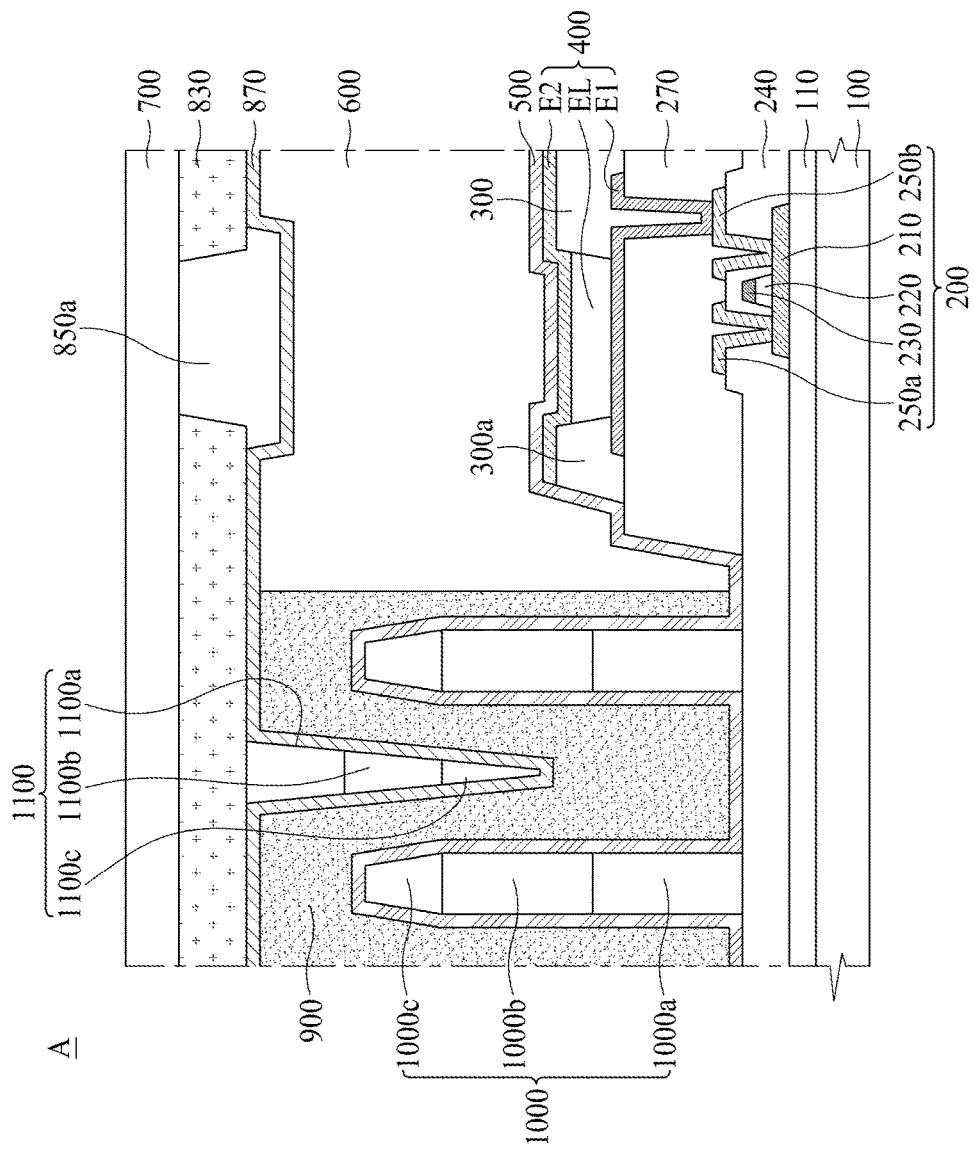
FIG. 3 is a cross-sectional view showing enlarged 'A' portion of FIG. 1 in an electroluminescent display device according to a second aspect of the present disclosure.

FIG. 3 is a cross-sectional view showing enlarged 'A' portion of FIG. 1 in an electroluminescent display device according to a second aspect of the present disclosure. The structure shown in FIG. 3 can be obtained by additionally providing a second passivation layer to the above structure of FIG. 2. Hereinafter, a detailed description for the same parts as those of the above will be omitted, and only the different structures will be described in detail as follows.

Referring to FIG. 3, the electroluminescent display device according to the second aspect of the present disclosure may include a second passivation layer 870.

The second passivation layer 870 is formed on a second substrate 700. In detail, the second passivation layer 870 may be formed on a lower surface of a black matrix 830 and a plurality of color filters 850. The second passivation layer 870 may be formed of an inorganic insulating material, for example, a single-layered structure of silicon dioxide ($SiO_2$) or silicon nitride ($SiN_x$), or a multi-layered structure of silicon dioxide ($SiO_2$) and silicon nitride ($SiN_x$), but not limited to these structures.

Herein, upper and side surfaces of an upper barrier pattern 1100 may be covered by the second passivation layer 870. For example, the second passivation layer 870 extends to the inside of a dam structure 900 so as to cover the upper barrier pattern 1100 as well as the black matrix 830 and the plurality of color filters 850. That is, after completing a deposition process for the plurality of color filters 850, the second passivation layer 870 may be formed on the entire surface of the second substrate 700 to cover the black matrix 830, the plurality of color filters 850, and the upper barrier pattern 1100.

The upper barrier pattern 1100 according to an aspect of the present disclosure is covered by the second passivation layer 870 of the inorganic material, so that permeation of external moisture and oxygen can be prevented with high efficiency. For example, even though the external moisture and oxygen may permeate into the inside of the device through the side surface of the dam structure 900 formed of an organic material, the permeation of external moisture and oxygen may be blocked by the upper barrier pattern 1100 having a thick thickness and the second passivation layer 870 for covering the upper barrier pattern 1100. The second passivation layer 870 is formed of the inorganic material having the property capable of preventing the permeation of moisture and oxygen. That is, the external moisture and oxygen cannot penetrate through the upper barrier pattern 1100 covered by the second passivation layer 870.

Accordingly, the electroluminescent display device according to the second aspect of the present disclosure may prevent external moisture and oxygen from being permeated into the inside of the device through the use of lower barrier pattern 1000 and the upper barrier pattern 1100. The lower barrier pattern 1000 and the upper barrier pattern 1100 may be respectively covered by the first passivation layer 500 and the second passivation layer 870 capable of preventing the permeation of external moisture and oxygen, and may be formed alternately. Thus, when external moisture and oxygen permeates through the lateral surface of the dam structure 900, a permeation path is increased so that the permeation of external moisture and oxygen becomes difficult, to thereby prevent the external moisture and oxygen from being permeated into a circuit device layer 200 and an emission device layer 400. Accordingly, in case of the electroluminescent display device according to the second aspect of the present disclosure, it is possible to improve reliability and lifespan of the electroluminescent display device by preventing the permeation of external moisture and oxygen.

The electroluminescent display device according to the second aspect of the present disclosure may include the lower barrier pattern 1000 and the upper barrier pattern 1100 so that it is possible to realize a narrow bezel by decreasing a bezel width in the electroluminescent display device. For example, as the dam structure 900 has the width of 5 mm at minimum so as to prevent the permeation of external moisture and oxygen, it has limitations on realization of the narrow bezel. However, the electroluminescent display device according to the second aspect of the present disclosure prevents the permeation of external moisture and oxygen through the use of lower barrier pattern 1000 and upper barrier pattern 1100. Thus, even though the dam structure 900 has the width of 5 mm or less than 5 mm, it is possible to ensure reliability of the electroluminescent display device without any problem. Accordingly, in case of the electroluminescent display device according to the second aspect of the present disclosure, the width of the dam structure 900 has the width of 5 mm or less, the bezel width can be reduced realize the narrow bezel.

Figure 4:
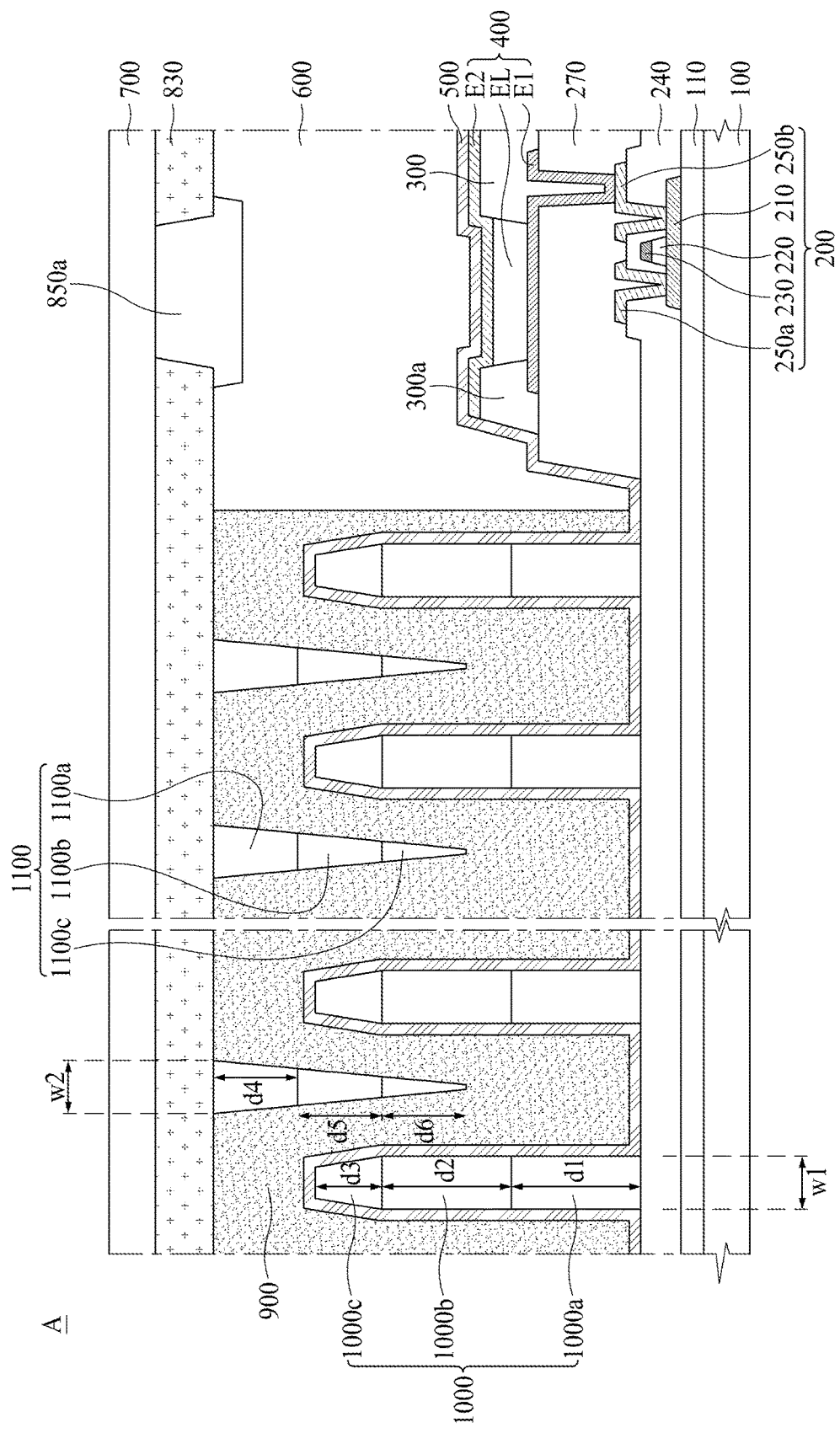
FIG. 4 is a cross-sectional view showing enlarged 'A' portion of FIG. 1 in an electroluminescent display device according to a third aspect of the present disclosure.
Figure 5:
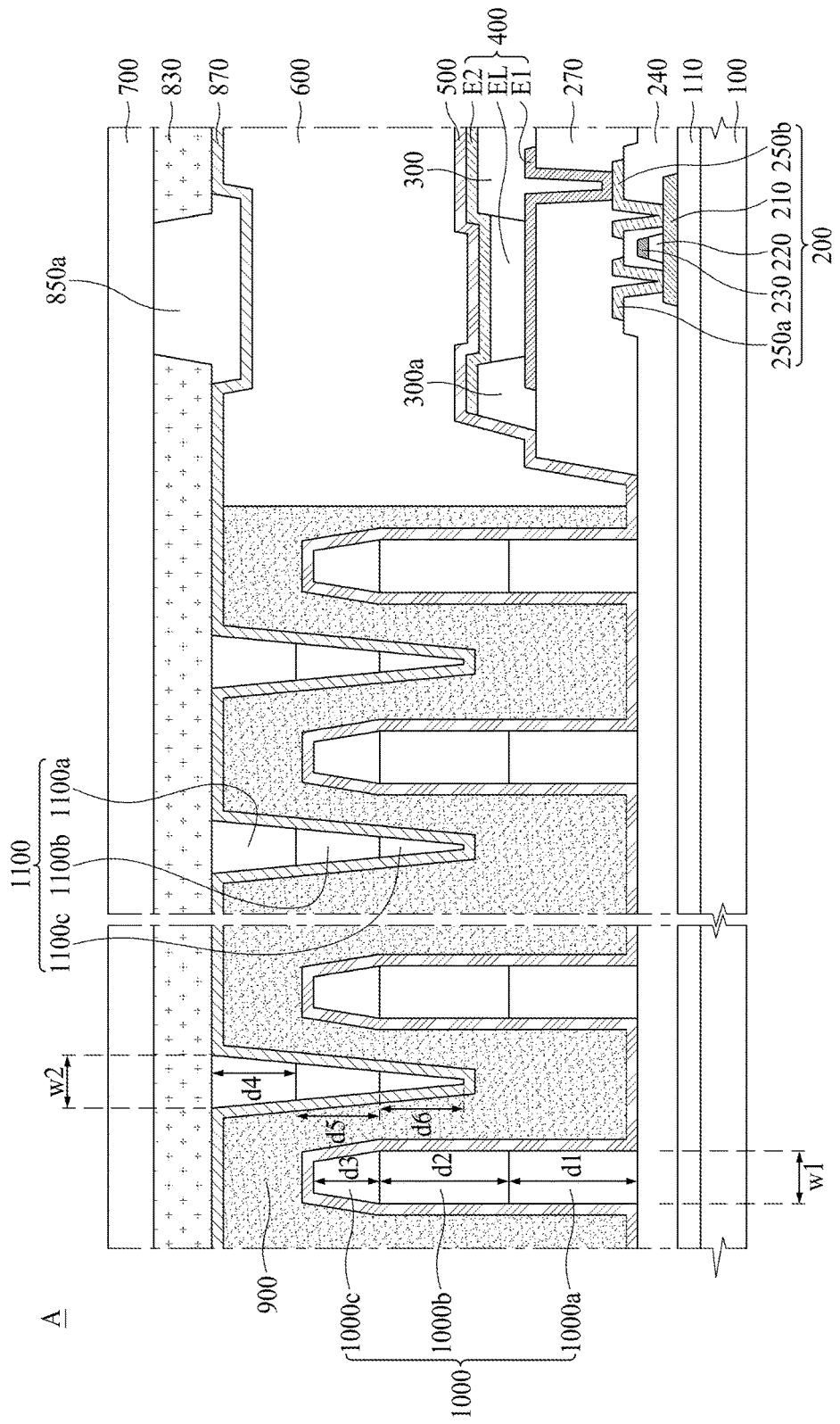
FIG. 5 is a cross-sectional view showing enlarged 'A' portion of FIG. 1 in an electroluminescent display device according to a fourth aspect of the present disclosure.

FIG. 4 is a cross-sectional view showing enlarged 'A' portion of FIG. 1 in an electroluminescent display device according to a third aspect of the present disclosure. FIG. 5 is a cross-sectional view showing enlarged 'A' portion of FIG. 1 in an electroluminescent display device according to a fourth aspect of the present disclosure. The structure of FIG. 4 can be obtained by changing the structure of the barrier pattern shown in FIG. 2. The structure of FIG. 5 can be obtained by changing a structure of a barrier pattern shown in FIG. 3. Hereinafter, a detailed description for the same parts as the above will be omitted, and only the different structures will be described in detail as follows.

Referring to FIGS. 4 and 5, the electroluminescent display devices according to the third and fourth aspects of the present disclosure may include lower and upper barrier patterns 1000 and 1100.

The lower barrier pattern 1000 is formed on a first substrate 100. The lower barrier pattern 1000 may have a first width w1. Herein, the first width w1 may be about 5 μm. In detail, a first lower barrier pattern 1000a may have the first width w1, and the lower barrier pattern 1000 may be provided at every interval of 10 μm in the same direction of the first width w1. As the result, the lower barrier pattern 1000 may have about 330~340 patterns. For example, a width of a dam structure 900 is 5 mm, and the lower barrier pattern 1000 is provided in such a way that the lower barrier pattern 1000 is positioned at both ends of the dam structure 900. In that case, the lower barrier pattern 1000 may have about 330~340 patterns.

The upper barrier pattern 1100 is formed on a second substrate 700. The upper barrier pattern 1100 may have a second width w2. Herein, the second width w2 is about 5 μm. In detail, a first upper barrier pattern 1100a may have the second width w2. The pattern number of the upper barrier pattern 1100 may be identical to or smaller than the pattern number of the lower barrier pattern 1000. For example, a width of a dam structure 900 is 5 mm, and the lower barrier pattern 1000 is provided in such a way that the lower barrier pattern 1000 is positioned at both ends of the dam structure 900, and the upper barrier pattern 1100 is positioned in-between. In this case, the pattern number of the upper barrier pattern 1100 may be smaller than the pattern number of the lower barrier pattern 1000 by one. However, the pattern numbers of the lower barrier pattern 1000 and the upper barrier pattern 1100 are not limited to these numbers, and the pattern numbers of the lower barrier pattern 1000 and the upper barrier pattern 1100 may be changed in various ways by adjusting the pattern width and the pattern interval.

The width in each of the lower barrier pattern 1000 and the upper barrier pattern 1100 according to one aspect of the present disclosure may be gradually decreased instead of being constant on the manufacturing process. The first width w1 may be 5 μm, and the second width w2 may be 5 μm, the lower barrier pattern 1000 and the upper barrier pattern 1100 may be provided at fixed interval of 10 μm. In that case, it is favorable to the alternate structure of the lower barrier pattern 1000 and the upper barrier pattern 1100. For example, the width in each of the lower barrier pattern 1000 and the upper barrier pattern 1100 is similar to the width of the dam structure 900, whereby it is difficult to provide an overlap structure, that is, the lower barrier pattern 1000 and the upper barrier pattern 1100 alternates with each other. In this case, when the lower barrier pattern 1000 having the first width w1 of the constant width and the upper barrier pattern 1100 having the second width w2 of the constant width are provided at fixed intervals, it is favorable to the alternate structure of the barrier patterns 1000 and 1100 on the manufacturing process. However, the structure of each of the lower barrier pattern 1000 and the upper barrier pattern 1100 is not limited to the above structure. Each of the lower barrier pattern 1000 and the upper barrier pattern 1100 may be formed in the structure having the constant width.

In case of the electroluminescent display devices according to the third and fourth aspects of the present disclosure, a permeation path of external moisture and oxygen may be increased through the use of lower barrier pattern 1000 and upper barrier pattern 1100. For example, the lower barrier pattern 1000 may have the thickness of 6~8 μm, the first passivation layer 500 for covering the lower barrier pattern 1000 may have the thickness of 1 μm in the same direction as the first to third thicknesses d1 to d3, the total thickness of the lower barrier pattern 1000 and the first passivation layer 500 may have the thickness of 7~9 μm, the upper barrier pattern 1100 may have the thickness of 6~7.5 μm, the second passivation layer 870 for covering the upper barrier pattern 1100 may have the thickness of 1 μm in the same direction as the fourth to sixth thicknesses d4 to d6, and the total thickness of the upper barrier pattern 1100 and the second passivation layer 870 may have the thickness of 7~8.5 μm. Accordingly, a permeation path of external moisture and oxygen is increased for each one of the lower barrier pattern 1000 and the upper barrier pattern 1100 by 13~16.5 μm at maximum. Considering both the lower barrier pattern 1000 and the upper barrier pattern 1100, the permeation path of the external moisture and oxygen may be increased up to 26~33 μm, which is increased two times in comparison to an initial permeation path (with a single structure of lower barrier pattern 1000 or upper barrier pattern 1100) of 15 μm.

In the electroluminescent display devices according to the third and fourth aspects of the present disclosure, the permeation path of external moisture and oxygen is increased two times through the use of lower barrier pattern 1000 and upper barrier pattern 1100. For example, the lower barrier pattern 1000 and the upper barrier pattern 1100 may be formed to have the pattern number of 330~340 patterns inside the dam structure 900 having the width of 5 mm, and the lower barrier pattern 1000 and the upper barrier pattern 1100 may be formed of the inorganic material having the property capable of preventing the permeation of moisture and oxygen. Accordingly, the external moisture and oxygen permeates through a vacant space between the lower barrier pattern 1000 and the upper barrier pattern 1100, whereby the permeation path is increased two times or more at maximum.

Accordingly, the electroluminescent display device according to the present disclosure is capable of preventing the external moisture and oxygen from being permeated into the inside of the device through the use of lower barrier pattern 1000 and the upper barrier pattern 1100. Also, the electroluminescent display device according to the present disclosure prevents the permeation of external moisture and oxygen, to thereby improve reliability of the electroluminescent display device, and extend the lifespan of the electroluminescent display device. Also, the electroluminescent display device according to the present disclosure includes the lower barrier pattern 1000 and the upper barrier pattern 1100 so that it is possible to reduce the bezel width of the electroluminescent display device, thereby realizing the narrow bezel.

In the electroluminescent display device according to the present disclosure, it is possible to improve reliability of the electroluminescent display device and to extend the lifespan of the electroluminescent display device by preventing the permeation of external moisture and oxygen.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. An electroluminescent display device comprising:
   a first substrate and a second substrate facing each other; and
   a dam structure bonding the first and second substrates with each other at outer edges of the first and second substrates,
   wherein the dam structure includes a barrier pattern that has a lower barrier pattern and an upper barrier pattern having multiple layers on the second substrate, and
   wherein the lower barrier pattern includes:
   a first lower barrier pattern on the first substrate;
   a second lower barrier pattern formed on the first lower barrier pattern; and
   a third lower barrier pattern formed on the second lower barrier pattern.

2. The electroluminescent display device according to claim 1, wherein the lower barrier pattern and the upper barrier pattern disposed alternately with each other.

3. The electroluminescent display device according to claim 1, wherein the lower barrier pattern has a thickness of 6~8 μm, and the upper barrier pattern has a thickness of 6~7.5 μm.

4. The electroluminescent display device according to claim 1, wherein each of the lower barrier pattern and the upper barrier pattern has a width of about 5 μm, and the lower barrier pattern and the upper barrier pattern are provided at every interval of 10 μm.

5. The electroluminescent display device according to claim 1, wherein the upper barrier pattern includes:
a first upper barrier pattern;
a second upper barrier pattern formed on the first upper barrier pattern; and
a third upper barrier pattern formed on the second upper barrier pattern.

6. The electroluminescent display device according to claim 1, further comprising:
a thin film transistor array disposed on the first substrate;
a planarization layer covering the thin film transistor array;
a bank disposed on the planarization layer and defining an emission area;
an emission device layer disposed on the planarization layer; and
a first passivation layer covering the emission device layer,
wherein the first and second lower barrier patterns are formed of the same material as the planarization layer, the third power barrier pattern is formed of the same material as the bank, and the first passivation layer covers the first to third lower barrier patterns.

7. The electroluminescent display device according to claim 5, further comprising first to third color filters disposed on the second substrate, wherein the first to third upper barrier patterns are formed of the same material as the first to third color filters.

8. The electroluminescent display device according to claim 7, further comprising a black matrix disposed on the second substrate and preventing a light leakage among the first to third color filters, wherein the black matrix is disposed on the first upper barrier pattern.

9. The electroluminescent display device according to claim 8, further comprising a second passivation layer contacting the first to third color filters and the black matrix.

10. The electroluminescent display device according to claim 9, wherein the second passivation layer contacts the first to third upper barrier patterns.

11. An electroluminescent display device comprising:
first and second substrates facing each other; and
a dam structure preventing surface moisture from permeating into the electroluminescent display device from a lateral side and disposed at outer edges of inner surfaces of the first and second substrates,
wherein the dam structure includes lower and upper barrier patterns respectively disposed on the first and second substrates and disposed alternately with each other, and
wherein the lower barrier pattern includes:
a first lower barrier pattern;
a second lower barrier pattern formed on the first lower barrier pattern; and
a third lower barrier pattern formed on the second lower barrier pattern.

12. The electroluminescent display device according to claim 11, wherein the upper barrier pattern includes:
a first upper barrier pattern;
a second upper barrier pattern formed on the first upper barrier pattern; and
a third upper barrier pattern formed on the second upper barrier pattern.

13. The electroluminescent display device according to claim 12, further comprising:
a thin film transistor array disposed on the first substrate;
a planarization layer covering the thin film transistor array;
a bank disposed on the planarization layer and defining an emission area;
an emission device layer disposed on the planarization layer; and
a first passivation layer covering the emission device layer,
wherein the first and second lower barrier patterns are formed of the same material as the planarization layer, the third power barrier pattern is formed of the same material as the bank, and the first passivation layer covers the first to third lower barrier patterns.

14. The electroluminescent display device according to claim 13, further comprising first to third color filters disposed on the second substrate, wherein the first to third upper barrier patterns are formed of the same material as the first to third color filters.

15. The electroluminescent display device according to claim 14, further comprising a black matrix disposed on the second substrate and preventing a light leakage among the first to third color filters, wherein the black matrix is disposed on the first upper barrier pattern.

16. The electroluminescent display device according to claim 15, further comprising a second passivation layer contacting the first to third color filters and the black matrix.

17. The electroluminescent display device according to claim 16, wherein the second passivation layer contacts the first to third upper barrier patterns.

* * * * *